US009437257B2

(12) United States Patent
Yang et al.

(10) Patent No.: US 9,437,257 B2
(45) Date of Patent: Sep. 6, 2016

(54) SENSING CIRCUIT, MEMORY DEVICE AND DATA DETECTING METHOD

(71) Applicants: Tien-Chun Yang, San Jose, CA (US); Yue-Der Chih, Hsinchu (TW); Chan-Hong Chern, Palo Alto, CA (US); Tao Wen Chung, San Jose, CA (US)

(72) Inventors: Tien-Chun Yang, San Jose, CA (US); Yue-Der Chih, Hsinchu (TW); Chan-Hong Chern, Palo Alto, CA (US); Tao Wen Chung, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 232 days.

(21) Appl. No.: 13/765,513

(22) Filed: Feb. 12, 2013

(65) Prior Publication Data

US 2014/0185401 A1    Jul. 3, 2014

Related U.S. Application Data

(60) Provisional application No. 61/747,797, filed on Dec. 31, 2012.

(51) Int. Cl.
| | |
|---|---|
| *G11C 11/34* | (2006.01) |
| *G11C 7/00* | (2006.01) |
| *G11C 7/02* | (2006.01) |
| *G11C 7/06* | (2006.01) |
| *G11C 7/14* | (2006.01) |
| *G11C 13/00* | (2006.01) |

(52) U.S. Cl.
CPC .............. *G11C 7/062* (2013.01); *G11C 7/14* (2013.01); *G11C 13/004* (2013.01); *G11C 2207/063* (2013.01)

(58) Field of Classification Search
USPC .......... 365/148, 163, 185.2, 185.21, 189.06, 365/189.09, 210.1
See application file for complete search history.

(56) References Cited

U.S. PATENT DOCUMENTS

| | | | | |
|---|---|---|---|---|
| 5,132,936 A | * | 7/1992 | Keswick et al. | 365/189.06 |
| 5,629,892 A | * | 5/1997 | Tang | 365/185.2 |
| 5,699,295 A | * | 12/1997 | Yero | 365/185.2 |
| 5,717,640 A | * | 2/1998 | Hashimoto | 365/185.2 |
| 5,784,314 A | * | 7/1998 | Sali et al. | 365/185.2 |
| 5,805,500 A | * | 9/1998 | Campardo et al. | 365/185.2 |
| 5,943,286 A | * | 8/1999 | Orita | 365/185.2 |
| 6,118,702 A | * | 9/2000 | Shieh et al. | 365/185.2 |
| 6,198,661 B1 | * | 3/2001 | Choi et al. | 365/185.2 |
| 6,215,697 B1 | * | 4/2001 | Lu et al. | 365/185.2 |
| 6,324,098 B1 | * | 11/2001 | Condemi et al. | 365/185.2 |
| 6,385,112 B1 | * | 5/2002 | Kurosaki | 365/185.2 |
| 6,400,607 B1 | * | 6/2002 | Pasotti et al. | 365/185.2 |
| 6,462,987 B2 | * | 10/2002 | Geraci et al. | 365/185.2 |
| 6,473,340 B1 | * | 10/2002 | Pasotti et al. | 365/185.2 |

(Continued)

*Primary Examiner* — Trong Phan
(74) *Attorney, Agent, or Firm* — Hauptman Ham, LLP

(57) ABSTRACT

A sensing circuit includes a sensing resistor, a reference resistor and a comparator. The comparator has a first input coupled to the sensing resistor, a second input coupled to the reference resistor, and an output. The first input is configured to be coupled to a data bit line associated with a memory cell to receive a sensing input voltage caused by a cell current of the memory cell flowing through the sensing resistor. The second input is configured to be coupled to a reference bit line associated with a reference cell to receive a sensing reference voltage caused by a reference current of the reference cell flowing through the reference resistor. The comparator is configured to generate, at the output, an output signal indicating a logic state of data stored in the memory cell based on a comparison between the sensing input voltage and the sensing reference voltage.

20 Claims, 6 Drawing Sheets

(56) References Cited

U.S. PATENT DOCUMENTS

| | | | |
|---|---|---|---|
| 6,535,428 B2 * | 3/2003 | Pasotti et al. | 365/185.2 |
| 6,751,126 B2 * | 6/2004 | Kim | 365/189.06 |
| 7,006,371 B2 * | 2/2006 | Matsuoka | 365/148 |
| 7,978,539 B2 * | 7/2011 | Lee et al. | 365/148 |
| 8,094,480 B2 * | 1/2012 | Tonomura | 365/148 |
| 8,194,437 B2 * | 6/2012 | Chen et al. | 365/148 |
| 8,259,515 B2 * | 9/2012 | Bedeschi et al. | 365/148 |
| 8,335,101 B2 * | 12/2012 | Jung et al. | 365/148 |
| 8,345,467 B2 * | 1/2013 | Kim et al. | 365/148 |
| 8,582,347 B2 * | 11/2013 | Jung et al. | 365/148 |
| 8,717,802 B2 * | 5/2014 | Lam et al. | 365/148 |

\* cited by examiner

SENSING CIRCUIT, MEMORY DEVICE AND DATA DETECTING METHOD

CROSS-REFERENCE TO RELATED APPLICATION

This application claims the priority of U.S. Provisional Application No. 61/747,797, filed Dec. 31, 2012, which is incorporated herein by reference in its entirety.

BACKGROUND

Sensing circuits are used to detect data stored in memory cells of memory devices. Some memory devices include reference cells with known data. A sensing circuit of the memory device compares a reference current flowing through a reference cell with a cell current flowing through a memory cell to detect data stored in the memory cell. A ratio of the cell current to the reference current when the sensing circuit toggles its output to indicate the detection of the stored data is referred to as "sensing ratio." Sensing ratio is a parameter related to various aspects of the sensing circuit and/or the memory device, e.g., speed, read accuracy etc., and is a consideration in design and operation of various memory devices.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
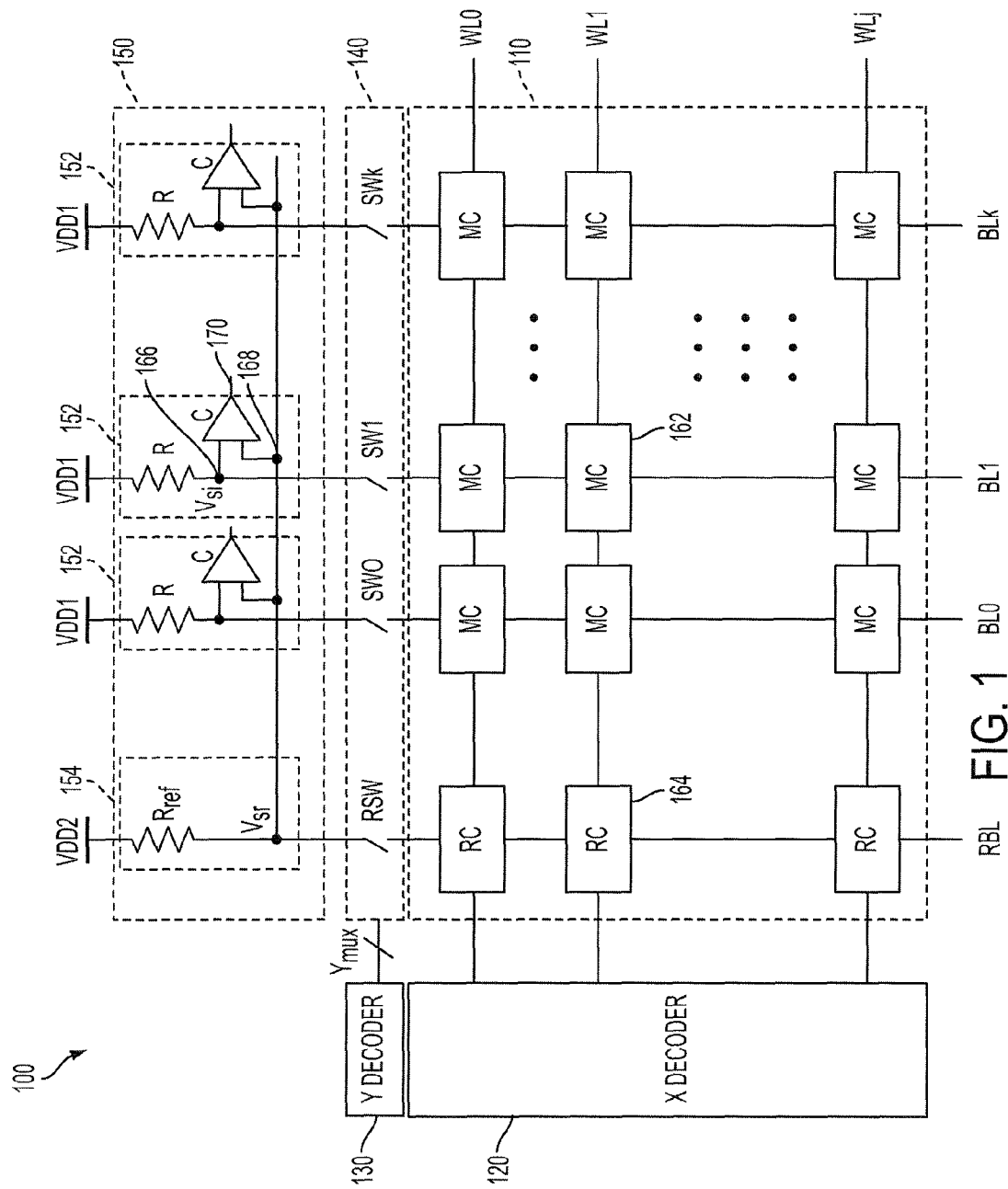
FIG. 1 is a schematic circuit diagram of a memory device in accordance with some embodiments.

It is to be understood that the following disclosure provides many different embodiments or examples, for implementing different features of various embodiments. Specific examples of components and arrangements are described below to simplify the present disclosure. The inventive concept may; however, be embodied in many different forms and should not be construed as being limited to the embodiments set forth herein. It will be apparent, however, that one or more embodiments may be practiced without these specific details. Like reference numerals in the drawings denote like elements.

In some embodiments, a sensing resistor and a reference resistor are used by a sensing circuit to detect a cell current flowing through a memory cell and a reference current flowing through a reference cell. The sensing ratio of the sensing circuit is defined by a ratio of a resistance of the reference resistor to a resistance of the sensing resistor. As a result, an accurate sensing ratio is achievable without one or more issues associated with other approaches where transistor matching and/or current mirrors are used. In one or more embodiments, the sensing resistor and/or the reference resistor is/are variable, thereby facilitating adjustment of the sensing ratio. In one or more embodiments, a bit line clamping circuit and/or a resistance calibration circuit is/are also provided.

FIG. 1 is a schematic circuit diagram of a memory device 100 in accordance with some embodiments. The memory device 100 includes a memory array 110, a row decoder/driver (X Decoder) 120, a column decoder/driver (Y Decoder) 130, a column selector 140, and a sensing circuit 150. In some embodiments, the memory device 100 further includes one or more write drivers for writing data to the memory array 110, one or more clock generators for providing clock signals for various components of the memory device 100, one or more input/output (I/O) units for data exchange with external devices, and/or one or more controllers for controlling various operations in the memory device 100. Other memory device configurations are within the scope of various embodiments.

The memory array 110 includes a plurality of memory cells MC arranged in a plurality of rows and columns. The memory cells MC in each column are coupled to a corresponding one among a plurality of data bit lines BL0-BLk. The memory cells MC in each row are coupled to a corresponding one among a plurality of word lines WL0-WLj. Any number of word lines and/or bit lines in the memory array are within the scope of various embodiments. The memory array 110 further includes at least one reference cell RC. In the specific embodiment illustrated in FIG. 1, the memory array 110 includes j reference cells RC arranged in a column and coupled to a reference bit line RBL. Each of the reference cells RC is coupled to a corresponding one among the word lines WL0-WLj. However, other numbers of reference cells, columns and/or rows of reference cells are within the scope of various embodiments.

In one or more embodiments, the memory cells MC include volatile memory cells which do not retain data after removal of power supply, or non-volatile memory cells which retain data after removal of power supply. Examples of volatile memory cells include, but are not limited to, static random access memory (SRAM) cells, dynamic random access memory (DRAM) cells etc. Examples of volatile memory cells include, but are not limited to, read-only memory (ROM) cells, electrically erasable programmable ROM (EEPROM) cells, flash memory cells etc. In one or more embodiments, the memory cells MC include single-level memory cells each of which is configured to store 1 bit of data, or multi-level memory cells each of which is configured to store 2 or more bits of data. A cell current flowing through a memory cell MC when the memory cell is accessed in a read operation depends on a logic state of data stored in the memory cell MC. For example, for a single-level memory cell, the cell current when the memory cell is in an erased state (i.e., the memory cell stores a logic "1") is higher than when the memory cell is in a programmed state (i.e., the memory cell stores a logic "0"). For a multi-level memory cell, the cell current has more than two current levels corresponding to more than two logic states of the multi-level memory cell. In at least one embodiment, the reference cells RC have the same configuration as the memory cells MC. The reference cells RC are configured, e.g., by appropriate programming, to have a predetermined reference current. By detecting and comparing the predetermined reference current of a reference cell RC and the cell current of a memory cell MC, it is possible to detect the logic state of the data stored in the memory cell MC, as described herein.

The row decoder/driver 120 is coupled to the memory array 110 via the word lines WL0-WLj. The row decoder/driver 120 decodes a row address of the memory cells MC selected to be accessed in a read operation or a write operation. The row decoder/driver 120 then enables the word line corresponding to the decoded row address to permit access to the selected memory cells MC. The column decoder/driver 130 decodes a column address of the memory cells MC selected to be accessed in a read operation or a write operation. The column decoder/driver 130 then enables, via the column selector 140, the bit line corresponding to the decoded row address to permit access to the selected memory cells MC. The column selector 140 includes a plurality of switches SW0-SWk and RSW each of which is coupled between the sensing circuit 150 and a corresponding one of the bit lines BL0-BLk and RBL. The switches SW0-SWk are controlled to be turned ON (closed) or OFF (open) in accordance with a decoded column address signal Ymux outputted by the column decoder/driver 130 to connect the corresponding data bit lines BL0-BLk to the sensing circuit 150. The switch RSW is also turned ON in accordance with the decoded column address signal Ymux, when one or more of the switches SW0-SWk are turned ON, so as to connect the reference bit line RBL to the sensing circuit 150.

The sensing circuit 150 includes a plurality of cell current sensing units 152 and a reference current sensing unit 154. Each of the cell current sensing units 152 is to be coupled to the corresponding data bit lines BL0-BLk via the corresponding switches SW0-SWk. In some embodiments, the column selector 140 is configured to connect one cell current sensing unit 152 to more than one data bit lines among the data bit lines BL0-BLk. In at least one embodiment, the sensing circuit 150 includes one cell current sensing unit 152 which is connectable via the column selector 140 to the data bit lines BL0-BLk. The reference current sensing unit 154 is configured to be coupled to the reference bit line RBL via the switch RSW. In some embodiments, the sensing circuit 150 includes more than one reference current sensing units 154. Other configurations are within the scope of various embodiments.

Each of the cell current sensing units 152, in accordance with some embodiments, includes a sensing resistor R and a comparator C. The reference current sensing unit 154, in accordance with some embodiments, includes a reference resistor Rref. The sensing resistor R is coupled between a first power supply voltage node VDD1 and a first input of the comparator C. The reference resistor Rref is coupled between a second power supply voltage node VDD2 and a second input of the comparator C. The comparator C further includes an output for outputting an output signal indicating a logic state of data stored in a selected memory cell based on a comparison between voltages at the first input and the second input. In at least one embodiment, power supply voltages at the first and second power supply voltage nodes VDD1 and VDD2 are different from each other. For simplicity, the power supply voltages at the first and second power supply voltage nodes VDD1 and VDD2 are the same in the following description, and is referred to as the power supply voltage VDD.

When a memory cell MC, e.g., the memory cell 162, is selected for a read operation, the word line WL1 corresponding to the memory cell 162 is activated and the data bit line BL1 corresponding to the memory cell 162 is connected by the corresponding switch SW1 to the corresponding cell current sensing unit 152. The activation of the word line WL1 also selects a corresponding reference cell RC that is coupled to the word line WL1, i.e., the reference cell 164. The reference bit line RBL is connected by the switch RSW to the reference current sensing unit 154. The selected memory cell 162 and the selected reference cell 164 cause a cell current and a reference current to flow in the corresponding data bit line BL1 and reference bit line RBL. The cell current and reference current cause corresponding voltage drops across the corresponding sensing resistor R and reference resistor Rref. The voltage drops are reflected as a sensing input voltage Vsi and a sensing reference voltage Vsr on a first input 166 and a second input 168 of the comparator C in the cell current sensing unit 152 corresponding to the memory cell 162. The comparator C compares the sensing input voltage Vsi and sensing reference voltage Vsr on the first input 166 and second input 168, and generates, at an output 170 thereof, an output signal indicating a logic state of data stored in the memory cell 162, as described in detail herein. In one or more embodiments, when more than one memory cells MC on the same activated word line are selected for a read operation, the sensing reference voltage Vsr is commonly supplied to the comparators C of the cell current sensing units 152 corresponding to the selected memory cells MC for comparison with the corresponding sensing input voltages Vsi associated with the selected memory cells MC.

Figure 2:
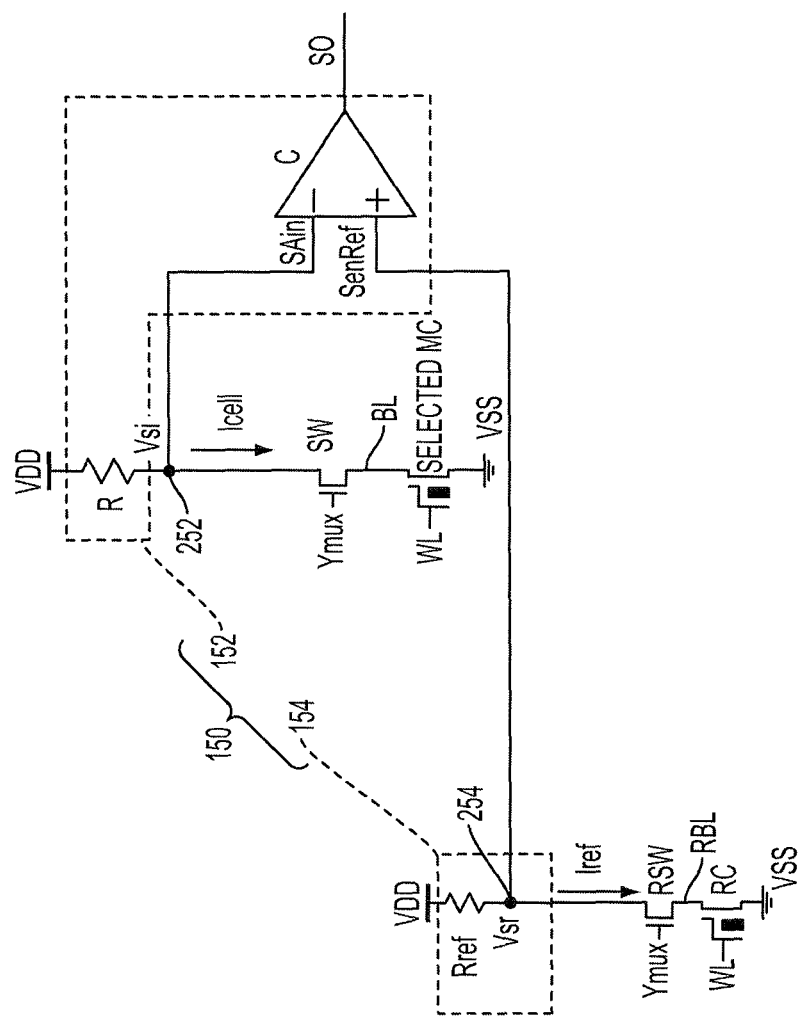
FIG. 2 is a schematic circuit diagram of a segment of the memory device including a sensing circuit in accordance with some embodiments.

FIG. 2 is a schematic circuit diagram of a segment of the memory device 100 that includes the sensing circuit 150 and other components of the memory device 100 related to a read operation of a selected memory cell MC. The selected memory cell MC is coupled via a data bit line BL and switch SW to a sensing resistor R in a cell current sensing unit 152. A reference cell RC is coupled via a reference bit line RBL and switch RSW to a reference resistor Rref in a reference current sensing unit 154. The selected memory cell MC and the corresponding reference cell RC are selected by activating a corresponding word line WL coupled to the selected memory cell MC and the reference cell RC. In one or more embodiments, the selected memory cell MC, the corresponding reference cell RC, the data bit line BL, the reference bit line RBL, the switch SW, and the switch RSW correspond to the memory cell 162, the reference cell 164, the data bit line BL1, the reference bit line RBL, the switch SW1 and the switch RSW discussed with respect to FIG. 1.

When the memory cell MC is selected by activating the word line WL, a cell current Icell flows from the data bit line BL through the selected memory cell MC to a ground voltage node VSS. A current level of the cell current Icell depends on a logic state of the data stored in the memory cell MC. Because the data bit line BL is connected to the sensing resistor R in the cell current sensing unit 152 via the switch SW which is turned ON (i.e., closed) in response to the decoded column address signal Ymux, the cell current Icell flows from the power supply voltage node VDD, through the sensing resistor R, via a first node 252, via the data bit line BL, and through the memory cell MC to the ground. The cell current Icell causes a voltage drop Icell×R across the sensing resistor R. As a result, a sensing input voltage Vsi at the first node 252 is determined as Vsi=VDD−Icell×R. The first node 252 is coupled to a first input SAin, e.g., an inverting input, of the comparator C.

When the reference cell RC is selected by activating the word line WL, a reference current Iref flows from the reference bit line RBL through the reference cell RC to the ground voltage node VSS. A current level of the reference current Iref is known and depends on a known programmed state of the reference cell RC. In one or more embodiments, the reference cell RC is in an erased state, and the cell current Icell has a high current level corresponding to a logic "1." In one or more embodiments, the reference cell RC is programmed to have a state between a logic "0" and a logic "1" which results in the reference current Iref having an intermediate current level between the high current level corresponding to a logic "1" and a low current level corresponding to a logic "0." Because the reference bit line RBL is connected to the reference resistor Rref in the reference current sensing unit 154 via the switch RSW which is turned ON (i.e., closed) in response to the decoded column address signal Ymux, the reference current Iref flows from the power supply voltage node VDD, through the reference resistor Rref, via a second node 254, via the reference bit line RBL, and through the reference cell RC to the ground. The reference current Iref causes a voltage drop Iref×Rref across the reference resistor Rref. As a result, a sensing reference voltage Vsr at the second node 254 is determined as Vsr=VDD−Iref×Rref. The second node 254 is coupled to a second input SenRef, e.g., a non-inverting input, of the comparator C.

The comparator C compares the sensing input voltage Vsi and the sensing reference voltage Vsr at the inputs thereof to generate, at an output SO, an output signal (also referred to herein as SO) indicating a logic state of data stored in the memory cell MC. For example, when the sensing input voltage Vsi is greater than the sensing reference voltage Vsr, the output SO is a logic "0" which indicates that a logic "0" is stored in the memory cell MC. When the sensing input voltage Vsi is lower than the sensing reference voltage Vsr, the output SO is a logic "1" which indicates that a logic "1" is stored in the memory cell MC.

The comparator C toggles the output signal SO (e.g., from a logic "0" to a logic "1," or vice versa) when the voltages at the inputs are equal, i.e., when the following relationships are satisfied $$Vsi=Vsr,$$

$$VDD-Icell \times R = VDD - Iref \times Rref,$$

$$Icell \times R = Iref \times Rref,$$

$$Icell/Iref = Rref/R.$$

The ratio Icell/Iref when the comparator C toggles the output signal SO is the sensing ratio of the sensing circuit 150. In other words, the sensing ratio of the sensing circuit 150 is defined by the ratio Rref/R, i.e., by the ratio of a resistance of the reference resistor to the resistance of the sensing resistor R. Because resistors are subject to lower process, voltage, and/or temperature (PVT) variations than transistors, accurate sensing ratios defined by resistors are easier to achieve in accordance with some embodiments than in other approaches where sensing ratios are defined by transistors using techniques such as current mirrors and/or transistor matching. Other issues related to sensing ratios defined by transistors, such as inaccurate sensing due to channel length modulation and/or threshold voltage mismatch, are also avoidable in one or more embodiments by using resistors to define the sensing ratio.

Figure 3:
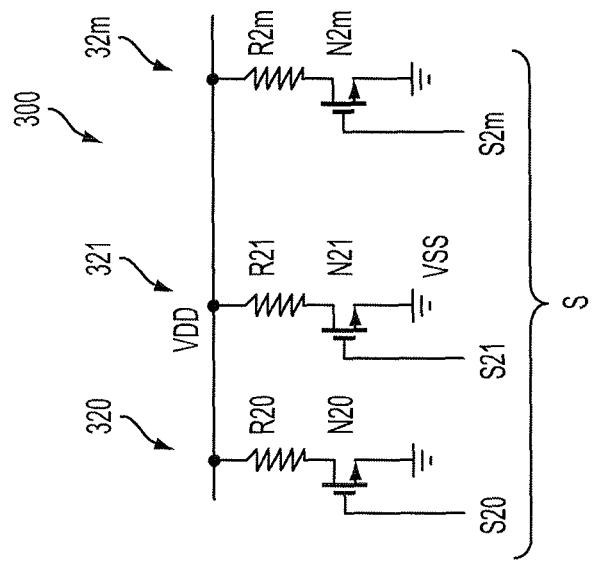
FIG. 3 is a schematic circuit diagram of a variable resistor in accordance with some embodiments.

In some embodiments, at least one of the sensing resistor R or the reference resistor Rref is a variable resistor. An example of a variable resistor 300 in accordance with some embodiments will be described with respect to FIG. 3. The variable resistor 300 is used in at least one embodiment as the sensing resistor R or the reference resistor Rref. The variable resistor 300 includes a plurality of interconnected circuits 320, 321, . . . 32m, where m is a positive integer. Each of the circuits includes a resistor R20, R21, . . . or R2m, coupled with a corresponding transistor N20, N21, . . . or N2m. The gates of the transistors N20, N21, . . . N2m are coupled to receive corresponding gate control signals S20, S21, . . . S2m which together define a control signal S. By applying an appropriate logic value "0" or "1" to the gate of each of the transistors N20, N21, . . . N2m, the corresponding resistors R20, R21, . . . R2m are enabled or disabled to vary the resistance of the variable resistor 300. In the specific configuration of the variable resistor 300 in FIG. 3, the circuits 320, 321, . . . 32m are coupled in parallel between the power supply voltage node VDD and the ground voltage node VSS, and in each of the circuits 320, 321, . . . 32m, the resistor R20, R21, . . . or R2m is coupled in series with the corresponding transistor N20, N21, . . . or N2m. However, other arrangements of serial and/or parallel interconnections among the circuits 320, 321, . . . 32m and/or between the resistor(s) and the corresponding transistor(s) in one or more circuits are within the scope of various embodiments. In one or more embodiments, the resistors R20, R21, . . . R2m are made of poly silicon (poly resistors) and the transistors N20, N21, . . . N2m are n-channel metal-oxide semiconductor (NMOS) transistors. Other types of resistor, such as diffused resistors, ion-implanted resistors, and metal resistors, and/or other types of transistor, such as p-channel metal-oxide semiconductor (PMOS) transistors, are within the scope of various embodiments.

Because the sensing ratio of the sensing circuit 150 is defined by the ratio Rref/R, an adjustment of the sensing ratio is achievable, in at least one embodiment, simply by varying one or both of the sensing resistor R and the reference resistor Rref. In at least one embodiment, the adjustment is achievable on the fly, i.e., during operation of the memory device 100, by varying one or more of the gate control signals S20, S21, . . . S2m. This provides greater flexibility in sensing ratio selection and/or adjustment than in other approaches which use transistor matching and/or current mirrors to define sensing ratios.

In some embodiments, the capability to adjust the sensing ratio further improves the read speed. Specifically, due to one or more PVT variations, current cells of the memory cells MC in the memory device 100 have different current levels when the memory cells MC store data of the same logic state. For example, in a specific memory configuration, current cells of the memory cells MC in the erased state vary in a range of 28-30 microamps, and current cells of the memory cells MC in the programmed state vary in a range of 0-2 microamps. To balance a read speed of memory cells MC storing a logic "0" with a read speed of memory cells MC storing a logic "1," the sensing circuit 150 in one or more embodiments is configured to toggle the output signal OS of the comparator C when the cell current Icell is equal to a threshold current level of 15 microamps, which is the midpoint between the two ranges of 28-30 microamps and 0-2 microamps. When the reference cell RC is programmed to be in an erased state, it is expected that the reference current Iref has a current level of 30 microamps, and at a sensing ratio of 0.5, the intended threshold current level of 15 microamps is achieved. However, due to one or more PVT variations, there is a possibility that the actual current level of the reference current Iref is not 30 microamps. For example, the actual current level of the reference current Iref is 28 microamps. At a sensing ratio of 0.5, the actual current level of 28 microamps of the reference current Iref results in a threshold current level of 14 microamps which is not at the midpoint between the ranges of 0-2 microamps and 28-30 microamps. As a result, the read speed of memory cells MC storing a logic "1" is different from the read speed of memory cells MC storing a logic "0," which results in a slower overall read speed of the memory device 100. In one or more embodiments, by adjusting one or both of the reference resistor Rref and the sensing resistor R, the sensing ratio of the sensing circuit 150 is adjusted (e.g., to be 0.536) to match the actual current level of the reference current Iref to bring the threshold current level of the cell current Icell to the intended threshold current level (e.g., 15 microamps), thereby balancing the read speed of memory cells MC storing a logic "1" and the read speed of memory cells MC storing a logic "0," which improves the overall read speed of the memory device 100.

Figure 4:
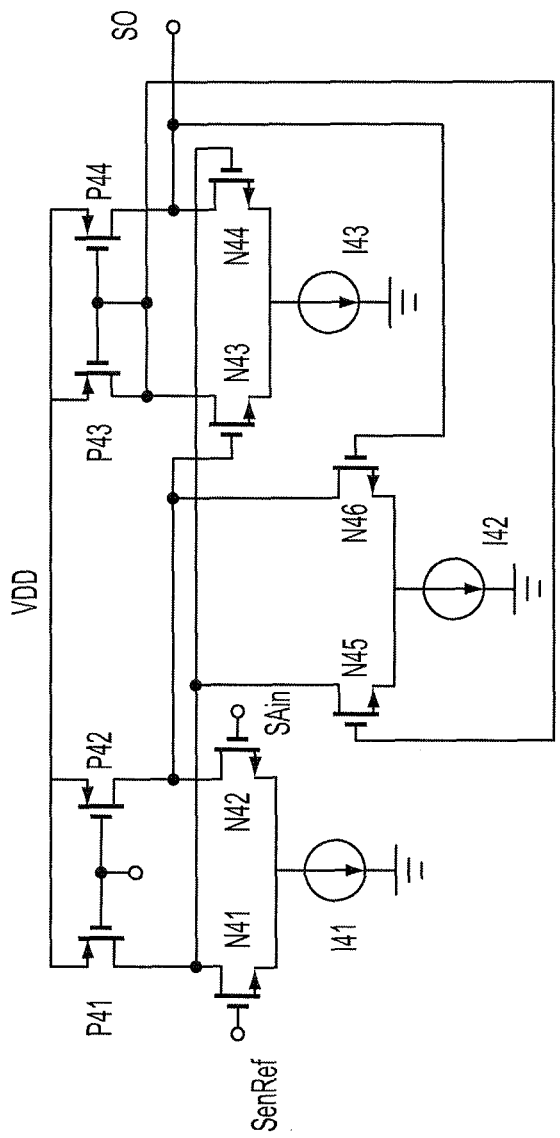
FIG. 4 is a schematic circuit diagram of a comparator in accordance with some embodiments.

FIG. 4 is a schematic circuit diagram of a high speed operational amplifier in accordance with some embodiments. The operational amplifier is used in at least one embodiment as the comparator C. The operational amplifier includes a plurality of PMOS transistors P41-P42, a plurality of NMOS transistors N41-N46, and a plurality of current sources I41-I43, which are coupled together in a configuration known in the art and operate in a manner known in the art. Other configurations for the comparator C are within the scope of various embodiments.

Figures 5, 6A, 6B, 6C:
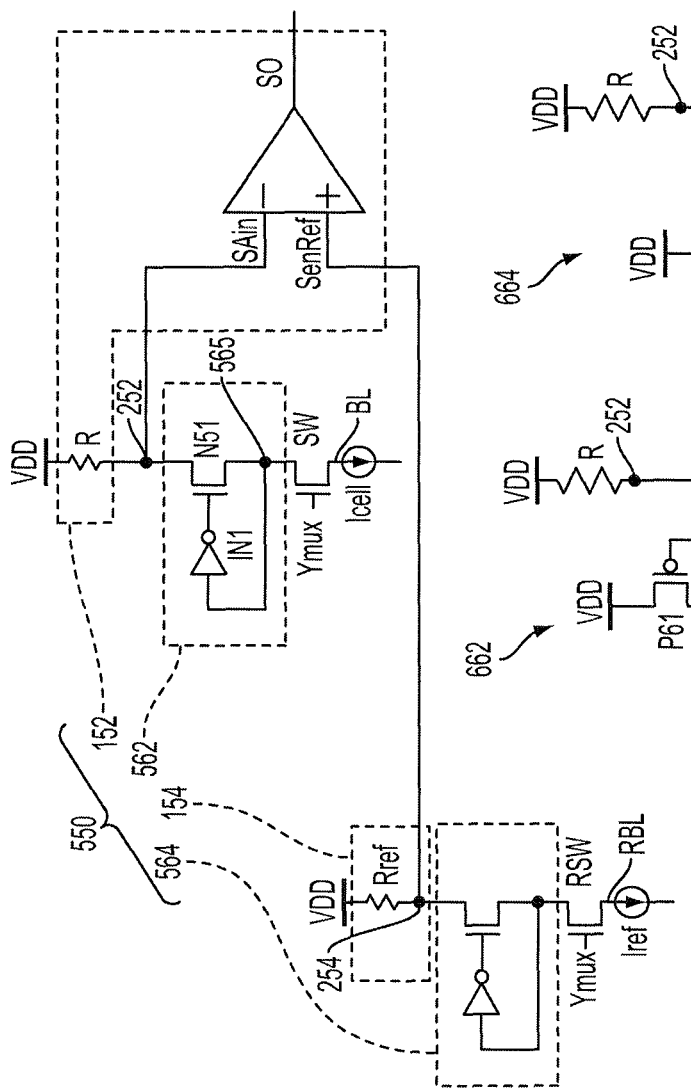
FIG. 5 is a schematic circuit diagram of a sensing circuit in accordance with some embodiments.
FIGS. 6A-6C are schematic circuit diagrams of various bit line clamping circuits in accordance with some embodiments.

FIG. 5 is a schematic circuit diagram of a sensing circuit 550 in accordance with some embodiments. Compared to the sensing circuit 150 described with respect to FIG. 2, the sensing circuit 550 additionally includes a data bit line clamping circuit 562 and a reference bit line clamping circuit 564. The data bit line clamping circuit 562 is coupled between the first input SAin of the comparator C and the switch SW. The reference data bit line clamping circuit 564 is coupled between the second input SenRef of the comparator C and the switch RSW. Each of the data bit line clamping circuit 562 and reference data bit line clamping circuit 564 is configured to clamp a voltage on the corresponding data bit line BL and reference bit line RBL to a predetermined voltage level. In one or more embodiments, the predetermined voltage level is selected to protect the corresponding memory cells MC or reference cell RC from over voltage when the data bit line BL or reference bit line RBL is connected via the corresponding switch SW or switch RSW to the sensing circuit 550. An actual value of the predetermined voltage level is determined based on various configuration and operation aspects of the memory device 100.

An example configuration of the data bit line clamping circuit 562 includes a NMOS transistor N51 and an inverter IN1. The NMOS transistor N51 has a drain coupled to the first input SAin of the comparator C via the first node 252, a source coupled to the data bit line BL via the switch SW, and a gate coupled to an output of the inverter IN1. The inverter IN1 further has an input coupled to the source of the NMOS transistor N51 via a node 565. The NMOS transistor N51 is configured as a variable resistor having a resistance dependent on a gate voltage at the gate thereof. In operation, when a voltage at the node 565, i.e., at the input of the inverter IN1, drops below the predetermined voltage level, a voltage at the output of the inverter IN1 increases. Because the output of the inverter IN1 is coupled to the gate of the NMOS transistor N51, the gate voltage at the gate of the NMOS transistor N51 also increases. As a result, the resistance of the NMOS transistor N51 is reduced which reduces the voltage drop across the NMOS transistor N51 and raises the voltage at the node 565 toward the predetermined voltage level. When the voltage at the node 565, i.e., at the input of the inverter IN1, increases above the predetermined voltage level, the voltage at the output of the inverter IN1 decreases and the gate voltage at the gate of the NMOS transistor N51 also decreases. As a result, the resistance of the NMOS transistor N51 increases which increases the voltage drop across the NMOS transistor N51 and lowers the voltage at the node 565 toward the predetermined voltage level. Therefore, when the data bit line BL is connected to the sensing circuit 550 via the switch SW, the voltage at the node 565 having the predetermined voltage level is applied to the selected memory cell MC via the data bit line BL. In at least one embodiment, the reference data bit line clamping circuit 564 is configured and operates similarly to the data bit line clamping circuit 562. Other bit line clamping circuit configurations are within the scope of various embodiments.

For example, FIGS. 6A-6C are schematic circuit diagrams of various bit line clamping circuits in accordance with some embodiments. The bit line clamping circuit 662, 664 or 666 in FIGS. 6A-6C, respectively, is used, in some embodiments, as the data bit line clamping circuit 562 described with respect to FIG. 5. In one or more embodiments, the bit line clamping circuit 662, 664 or 666 in FIGS. 6A-6C, respectively, is used as the reference data bit line clamping circuit 564 described with respect to FIG. 5.

The bit line clamping circuit 662 in FIG. 6A includes NMOS transistors N61 and N62 and a PMOS transistor P61. The NMOS transistor N61 has a drain coupled to the first node 252, a source coupled to the data bit line BL via the node 565, and a gate coupled to a node 665. The NMOS transistor N62 has a drain coupled to the gate of the NMOS transistor N61 via the node 665, a source coupled to the ground voltage node VSS, and a gate coupled to the node 565. The PMOS transistor P61 has a drain coupled to the gate of the NMOS transistor N61 via the node 665, a source coupled to a power supply voltage node Vdd, and a gate coupled to the node 565. In one or more embodiments, the supply voltages on the power supply voltage node VDD and the power supply voltage node Vdd are the same. The NMOS transistors N61, N62 and PMOS transistor P61 are each configured as a variable resistor having a resistance dependent on a gate voltage at the gate thereof. The PMOS transistor P61 and NMOS transistor N62 together define an inverter having an input at the node 565 coupled to the source of the NMOS transistor N61, and an output at the node 665 coupled to the gate of the NMOS transistor N61. In this aspects, the bit line clamping circuit 662 operates similarly to the data bit line clamping circuit 562 described with respect to FIG. 5.

Specifically, when the voltage at the node 565 drops, the gate voltage at the NMOS transistor N62 and the PMOS transistor P61 also drops. As a result, a resistance of the PMOS transistor P61 decreases and a resistance of the NMOS transistor N62 increases. Because the PMOS transistor P61 and the NMOS transistor N62 define a voltage divider between the power supply voltage node Vdd and the ground voltage node VSS, the voltage at the node 665 between the PMOS transistor P61 and the NMOS transistor N62 increases. As a result, the gate voltage of the NMOS transistor N61 increases, the resistance of the NMOS transistor N61 is reduced which reduces the voltage drop across the NMOS transistor N61 and raises the voltage at the node 565 toward the predetermined voltage level. The process is reversed when the voltage at the node 565 rises. Thus, the voltage at the node 565, i.e., the voltage on the data bit line BL when the data bit line BL is coupled to the node 565, is clamped to the predetermined voltage level. The specific value of the predetermined voltage level is determined by particular configurations, such as length, width, drive strength etc. of one or more of the NMOS transistors N61, N62 and PMOS transistor P61.

The bit line clamping circuit 664 in FIG. 6B includes an NMOS transistor N63. The NMOS transistor N63 has a drain coupled to the first node 252, a source coupled to the data bit line BL via the node 565, and a gate coupled to the power supply voltage node Vdd. As a result the NMOS transistor N63 is an always ON transistor. The voltage at the source of the NMOS transistor N63 is determined by the supply voltage Vdd at the gate of the NMOS transistor N63 minus a threshold voltage of the NMOS transistor N63. The threshold voltage of the NMOS transistor N63 is determined by a specific configuration of the NMOS transistor N63, and is about 0.7 V in one or more embodiments. Thus, the voltage at the source of the NMOS transistor N63, and the data bit line BL when coupled to the source of the NMOS transistor N63 via the node 565, is clamped to a predetermined voltage level which, in one or more embodiments, is Vdd-0.7 V.

The bit line clamping circuit 666 in FIG. 6C includes NMOS transistors N64 and N65 and a PMOS transistor P62 which correspond to the NMOS transistors N61 and N62 and the PMOS transistor P61 discussed with respect to FIG. 6A. A difference between the bit line clamping circuits 662 and 666 is that the gate of the PMOS transistor P62 is coupled to the ground voltage node VSS, and as a result, the PMOS transistor P62 has a fixed resistance. Other than this difference, the bit line clamping circuit 666 operates similarly to the bit line clamping circuit 662 discussed with respect to FIG. 6A.

Figure 7:
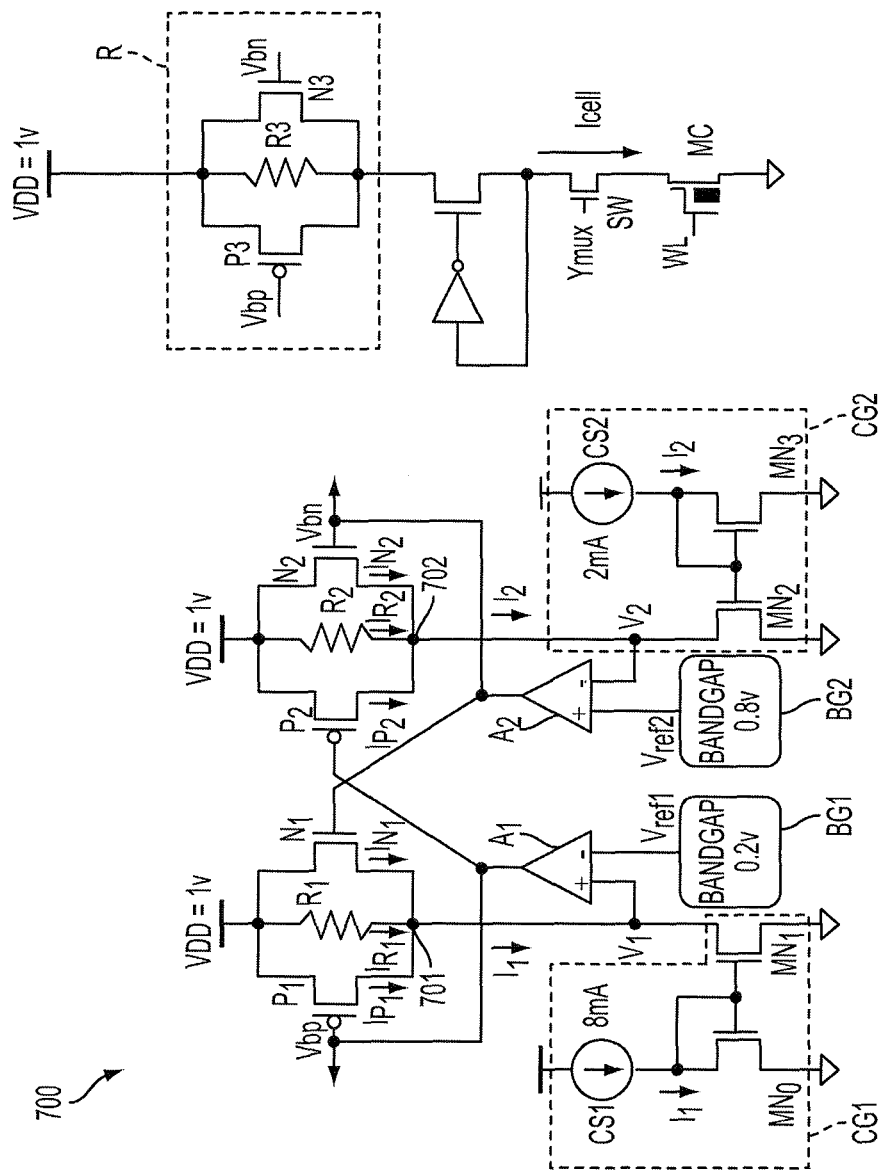
FIG. 7 is a schematic circuit diagram of a resistance calibration circuit in accordance with some embodiments.

FIG. 7 is a schematic circuit diagram of a resistance calibration circuit 700 in accordance with some embodiments. As discussed herein, resistors are subject to lower PVT variations than transistors, and permit an accurate sensing ratio defined by the sensing resistor R and reference resistor Rref to be achieved in some embodiments. However, there are situations where one or both of the sensing resistor R and the reference resistor Rref is/are manufactured with some resistance inaccuracies that possibly cause corresponding inaccuracies in the sensing ratio. One or more embodiments provide a resistance calibration circuit for at least one of the sensing resistor R or the reference resistor Rref to correct resistance inaccuracies and bring the calibrated resistor to the intended resistance. An example resistance calibration circuit 700 for calibrating the sensing resistor R is described herein with respect to FIG. 7. In at least one embodiment, the resistance calibration circuit 700 is used to calibrate the reference resistor Rref. Other resistance calibration circuit configurations are within the scope of various embodiments.

The resistance calibration circuit 700 includes a first resistor R1, a first PMOS transistor P1, and a first NMOS transistor N1 coupled in parallel with each other. The resistor R1, PMOS transistor P1 and NMOS transistor N1 are referred together herein as a first PMOS-resistor-NMOS (PRN) set. A source of the PMOS transistor P1, one end of the resistor R1, and a drain of the NMOS transistor N1 are coupled together and to the power supply voltage node VDD. A drain of the PMOS transistor P1, the other end of the resistor R1, and a source of the NMOS transistor N1 are coupled together at a node 701. The resistance calibration circuit 700 further includes a second resistor R2, a second PMOS transistor P2, and a second NMOS transistor N2 coupled in parallel with each other similarly to the corresponding resistor R1, PMOS transistor P1 and NMOS transistor N1. The resistor R2, PMOS transistor P2 and NMOS transistor N3 are referred together herein as a second PRN set. The sensing resistor R to be calibrated by the resistance calibration circuit 700 includes a third resistor R3, a third PMOS transistor P3, and a third NMOS transistor N3 coupled in parallel with each other similarly to the corresponding resistor R1, PMOS transistor P1 and NMOS transistor N1. The resistor R3, PMOS transistor P3 and NMOS transistor N3 are referred together herein as a third PRN set. The first through third PRN sets are designed to have the same configuration, i.e., the resistors R1-R3 are designed to have the same configuration, the PMOS transistors P1-P3 are designed to have the same configuration, and the NMOS transistors N1-N3 are designed to have the same configuration. Gates of the PMOS transistors P1-P3 are commonly connected to receive a PMOS bias voltage Vbp. Gates of the NMOS transistors N1-N3 are commonly connected to receive an NMOS bias voltage Vbn. By controlling the PMOS bias voltage Vbp and NMOS bias voltage Vbn using the resistance calibration circuit 700, the resistance of the sensing resistor R, which is defined by resistances of the resistor R3, PMOS transistor P3, and NMOS transistor N3, is calibrated to have an intended value.

To control the PMOS bias voltage Vbp and NMOS bias voltage Vbn, the resistance calibration circuit 700 includes first and second operational amplifiers A1, A2 configured to generate the PMOS bias voltage Vbp and NMOS bias voltage Vbn. The resistance calibration circuit 700 further comprises first and second current generators CG1, CG2 and first and second band-gap reference circuits BG1, BG2. In some embodiments, first band-gap reference circuit BG1 is a 0.2V band-gap reference circuit. In some embodiments, second band-gap reference circuit BG2 is a 0.8V band-gap reference circuit. The operational amplifier A1 has a first input coupled to the first band-gap reference circuit BG1 to receive a first reference voltage Vref1 therefrom, a second input coupled between the node 701 and the current generator CG1, and an output coupled to the gates of the PMOS transistors P1-P3 to output the PMOS bias voltage Vbp thereto. A first current I1 generated by the current generator CG1 flows through the first PRN set. More particularly, the first current I1 includes component currents IR1, IP1 and IN1 flowing through the corresponding resistor R1, PMOS transistor P1 and NMOS transistor N1. The first current I1 causes a voltage drop across the first PRN set, and results in a first voltage V1 at the node 701 and the second input of the operational amplifier A1. The operational amplifier A1 compares the first voltage V1 with the first reference voltage Vref1 and output the PMOS bias voltage Vbp.

Similarly, the operational amplifier A2 has a first input coupled to the second band-gap reference circuit BG2 to receive a second reference voltage Vref2 therefrom, a second input coupled between a common node 702 of the second PRN set and the current generator CG2, and an output coupled to the gates of the NMOS transistors N1-N3 to output the NMOS bias voltage Vbn thereto. A second current I2 generated by the current generator CG2 flows through the second PRN set. More particularly, the second current I2 includes component currents IR2, IP2 and IN2 flowing through the corresponding resistor R2, PMOS transistor P2 and NMOS transistor N2. The second current I2 causes a voltage drop across the second PRN set, and results in a second voltage V2 at the node 702 and the second input of the operational amplifier A2. The operational amplifier A2 compares the second voltage V2 with the second reference voltage Vref2 and output the NMOS bias voltage Vbn.

In some embodiments, the current generator CG1 includes a current source CS1 coupled to the second input of the operational amplifier A1 via a current mirror defined by NMOS transistors MN0, MN1. Similarly, the current generator CG2 includes a current source CS2 coupled to the second input of the operational amplifier A2 via a current mirror defined by NMOS transistors MN2, MN3. Other current generator configurations are within the scope of various embodiments In the specific, non-limiting example given in FIG. 7, the power supply voltage VDD is 1 V, the first reference voltage Vref1 is 0.2 V, the second reference voltage Vref2 is 0.8 V, the first current I1 is 8 mA, the second current I2 is 2 mA, and the resistance calibration circuit 700 is configured to calibrate the sensing resistor R to a resistance of 100 Ohms. The total resistance of the first PRN set is defined by resistances of the resistor R1, PMOS transistor P1 and NMOS transistor N1. The total resistance of the second PRN set is defined by resistances of second resistor R2, PMOS transistor P2 and NMOS transistor N2. The total resistances of the first through third PRN sets are the same because the first through third PRN sets are designed to have the same configuration. When the total resistance of each PRN set is 100 Ohms, the first voltage V1 is equal to the first reference voltage Vref1, the voltage $V_2$ is equal to second reference voltage Vref2, and the resistance calibration circuit 700 is in an equilibrium state where the NMOS bias voltage Vbn and PMOS bias voltage Vbp keep the total resistance of each of the first PRN set and second PRN set at 100 Ohms. As a result, the sensing resistor R which has a resistance defined by the total resistance of the first PRN set is also kept by the PMOS bias voltage Vbp and NMOS bias voltage Vbn at 100 Ohms.

When, due to one or more PVT variations, the total resistance of each PRN set is less than 100 Ohms, the voltages V1, V2 at the second inputs of the operational amplifiers A1, A2 become larger than the corresponding reference voltages Vref1, Vref2 at the first inputs of the corresponding operational amplifiers A1, A2. The operational amplifier A1 increases the PMOS bias voltage Vbp supplied to the gates of the PMOS transistors P1 and P2, while the operational amplifier A2 decreases the NMOS bias voltage Vbn supplied to the gates of the NMOS transistors N1 and N2. The increased PMOS bias voltage Vbp at the gates of the PMOS transistors P1, P2 decrease the corresponding currents IP1, IP2 flowing through the PMOS transistors P1, P2. The decreased NMOS bias voltage Vbn at the gates of the NMOS transistors N1, N2 decrease the corresponding currents IN1 and IN2 flowing through the NMOS transistors N1 and N2. As a result, the currents IR1, IR2 flowing through the corresponding resistors R1, R2 increase to keep the total IR1+IP1+IN1 equal to I1 and the total IR2+IP2+IN2 equal to I2. The increased currents IR1, IR2 cause larger voltage drops across the corresponding resistors R1, R2 and bring the corresponding voltages V1, V2 down toward the corresponding reference voltage Vref1, Vref2, thereby reaching the equilibrium state where the total resistance of each of the first PRN set and second PRN set is 100 Ohms. As a result, the sensing resistor R controlled by the PMOS bias voltage Vbp and NMOS bias voltage Vbn is also at 100 Ohms.

The process is reversed when, due to one or more PVT variations, the total resistance of each PRN set is greater than 100 Ohms. Specifically, the operational amplifier A1 decreases the PMOS bias voltage Vbp and the operational amplifier A2 increases the NMOS bias voltage Vbn to increase the currents IN1, IN2, IP1, IP2, decrease the currents IR1, IR2, and increase the voltages V1, V2 to be equal with the corresponding reference voltages Vref1, Vref2.

Figure 8:
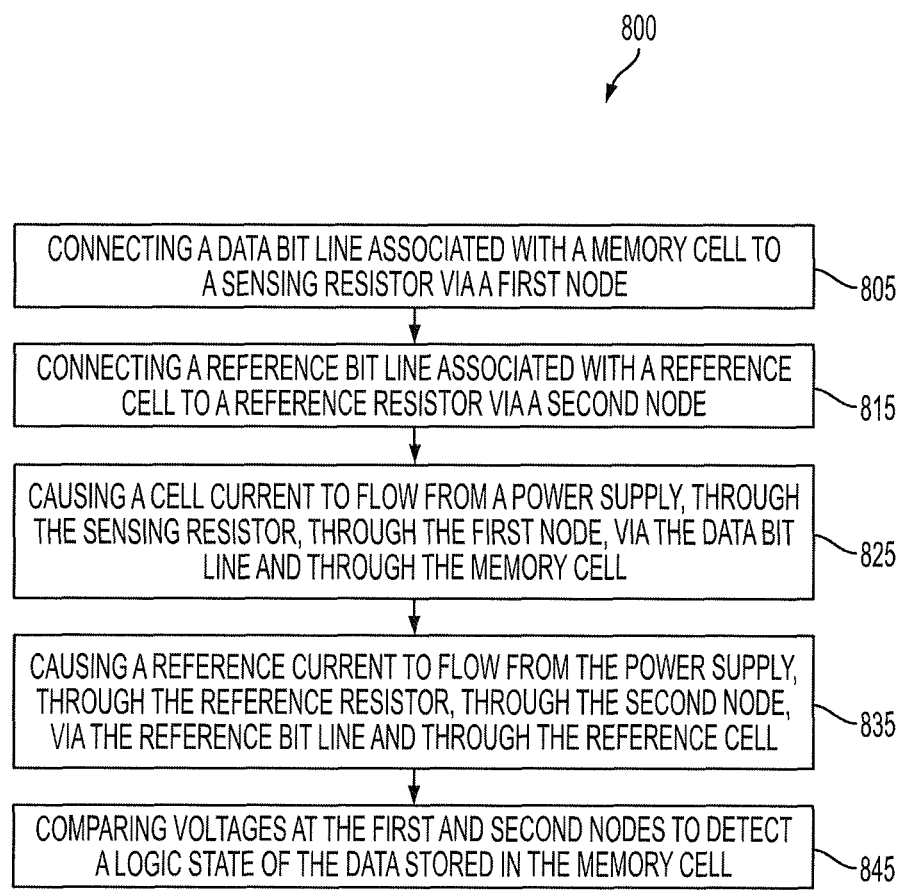
FIG. 8 is a flow chart of a method of detecting data stored in a memory cell in accordance with some embodiments.

FIG. 8 is a flow chart of a method 800 of detecting data stored in a memory cell in accordance with some embodiments. The method 800 is performed, in one or more embodiments, by the sensing circuit 150 to read data from a memory cell of the memory device 100 as discussed with respect to FIG. 2.

At operation 805, a data bit line associated with the memory cell is connected to a sensing resistor via a first node. For example, the data bit line BL associated with the memory cell MC is connected, by the switch SW, to the sensing resistor R via the first node 252, as described with respect to FIG. 2.

At operation 815, a reference bit line associated with a reference cell is connected to a reference resistor via a second node. For example, the reference bit line RBL associated with the reference cell RC is connected, by the switch RSW, to the reference resistor Rref via the second node 254, as described with respect to FIG. 2.

At operation 825, a cell current is caused to flow from a power supply, through the sensing resistor, through the first node, via the data bit line and through the memory cell. For example, the selection of the memory cell MC by the activation of the corresponding word line WL causes the cell current Icell to flow from the power supply voltage node VDD, through the sensing resistor R, through the first node 252, via the data bit line BL and through the memory cell MC, as described with respect to FIG. 2.

At operation 835, a reference current is caused to flow from the power supply, through the reference resistor, through the second node, via the reference bit line and through the reference cell. For example, the selection of the reference cell RC by the activation of the corresponding word line WL causes the reference current Iref to flow from the power supply voltage node VDD, through the reference resistor Rref, through the second node 254, via the reference bit line RBL and through the reference cell RC, as described with respect to FIG. 2.

At operation 845, voltages at the first and second nodes are compared to detect a logic state of the data stored in the memory cell. For example, the voltages Vsi, Vsr at the first and second nodes 252, 254 are compared by the comparator C to detect a logic state of the data stored in the memory cell MC, as described with respect to FIG. 2.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a sensing circuit comprises a sensing resistor, a reference resistor and a comparator. A ratio of a resistance of the reference resistor to a resistance of the sensing resistor defines a sensing ratio of the sensing circuit. The comparator has a first input coupled to the sensing resistor, a second input coupled to the reference resistor, and an output. The first input is configured to be coupled to a data bit line associated with a memory cell to receive a sensing input voltage caused by a cell current of the memory cell flowing through the sensing resistor. The second input is configured to be coupled to a reference bit line associated with a reference cell to receive a sensing reference voltage caused by a reference current of the reference cell flowing through the reference resistor. The comparator is configured to generate, at the output, an output signal indicating a logic state of data stored in the memory cell based on a comparison between the sensing input voltage and the sensing reference voltage.

According to some embodiments, a memory device comprises a data bit line, a reference bit line, a memory cell coupled to the data bit line, a reference cell coupled to the reference bit line, a sensing resistor, a reference resistor and a comparator. The sensing resistor has a first end coupled to a power supply voltage node and a second end. The reference resistor has a first end coupled to the power supply voltage node and a second end. The comparator has a first input coupled to the second end of the sensing resistor, a second input coupled to the second end of the reference resistor, and an output. The first input of the comparator is configured to be coupled to the memory cell via the data bit line, and the second input of the comparator is configured to be coupled to the reference cell via the reference bit line. The comparator is configured to generate, at the output, an output signal indicating a logic state of data stored in the memory cell based on a comparison between voltages at the first input and the second input.

According to some embodiments, in a method of detecting data stored in a memory cell, a data bit line associated with the memory cell is connected to a sensing resistor via a first node, and a reference bit line associated with a reference cell is connected to a reference resistor via a second node. A cell current is caused to flow from a power supply voltage node, through the sensing resistor, through the first node, via the data bit line and through the memory cell. A reference current is caused to flow from the power supply voltage node, through the reference resistor, through the second node, via the reference bit line and through the reference cell. Voltages at the first and second nodes are compared to detect a logic state of the data stored in the memory cell.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A sensing circuit, comprising:
   a plurality of sensing resistors, wherein each sensing resistor of the plurality of sensing resistors is configured to connect to a corresponding column of memory cells of a memory cell array;
   a reference resistor, a ratio of a resistance of the reference resistor to a resistance of the sensing resistor defining a sensing ratio of the sensing circuit, wherein at least one of a sensing resistor of the plurality of sensing resistors or the reference resistor is a variable resistor;
   a comparator having
      a first input coupled to the sensing resistor of the plurality of sensing resistors, the first input configured to be coupled to a data bit line associated with a memory cell to receive a sensing input voltage caused by a cell current of the memory cell flowing through the sensing resistor of the plurality of sensing resistors,
      a second input coupled to the reference resistor, the second input configured to be coupled to the reference bit line associated with a reference cell to receive a sensing reference voltage caused by a reference current of the reference cell flowing through the reference resistor, and
      an output, the comparator configured to generate at the output an output signal indicating a logic state of data stored in the memory cell based on a comparison between the sensing input voltage and the sensing reference voltage; and
   a resistance calibration circuit configured to automatically calibrate a total resistance of the sensing resistor of the plurality of sensing resistors or the reference resistor, the resistance calibration circuit comprising:
      a first resistor, a first PMOS transistor, and a first NMOS transistor coupled in parallel with each other; and
      a second resistor, a second PMOS transistor, and a second NMOS transistor coupled in parallel with each other.

2. The sensing circuit of claim 1, wherein
   the sensing resistor of the plurality of sensing resistors includes opposite ends coupled to a power supply voltage node and the first input of the comparator, respectively; and
   the reference resistor includes opposite ends coupled to the power supply voltage node and the second input of the comparator, respectively.

3. The sensing circuit of claim 1, wherein the variable resistor comprises a plurality of interconnected circuits each comprising a resistor and a transistor coupled to each other, the transistors configured to be selectively turned ON or OFF to vary the resistance of the variable resistor.

4. The sensing circuit of claim 1, further comprising:
   a bit line clamping circuit coupled to the first or second input of the comparator, the bit line clamping circuit configured to clamp a voltage on the corresponding data bit line or reference bit line to a predetermined voltage level.

5. The sensing circuit of claim 4, wherein the bit line clamping circuit comprises:
   a transistor having a first terminal coupled to the first or second input of the comparator, a second terminal configured to be coupled to the corresponding data bit line or reference bit line, and a gate terminal; and
   an inverter having an input coupled to the second terminal of the transistor, and an output coupled to the gate terminal of the transistor.

6. The sensing circuit of claim 4, wherein the bit line clamping circuit comprises:
   a transistor having a first terminal coupled to the first or second input of the comparator, a second terminal configured to be coupled to the corresponding data bit line or reference bit line, and a gate terminal coupled to a power supply voltage node.

7. The sensing circuit of claim 4, wherein the bit line clamping circuit comprises:

a p-channel metal-oxide semiconductor (PMOS) transistor having a source coupled to a power supply voltage node, a drain, and a gate coupled to a ground voltage node;
a first n-channel metal-oxide semiconductor (NMOS) transistor having a drain coupled to the first or second input of the comparator, a source configured to be coupled to the corresponding data bit line or reference bit line, and a gate coupled to the drain of the PMOS transistor; and
a second NMOS transistor having a drain coupled to the drain of the PMOS transistor, a source coupled to the ground voltage node, and a gate coupled to the source of the first NMOS transistor.

8. The sensing circuit of claim 1, further comprising:
a first bit line clamping circuit coupled to the first input of the comparator; and
a second bit line clamping circuit coupled to the second input of the comparator;
wherein each of the first and second bit line clamping circuits is configured to clamp a voltage on the corresponding one of the data bit line and the reference bit line to a predetermined voltage level.

9. The sensing circuit of claim 1,
wherein
the sensing resistor of the plurality of sensing resistors or the reference resistor to be calibrated by the resistance calibration circuit comprises a third resistor, a third PMOS transistor, and a third NMOS transistor coupled in parallel with each other;
gates of the first through third PMOS transistors are coupled with each other; and
gates of the first through third NMOS transistors are coupled with each other.

10. The sensing circuit of claim 1, wherein the resistance calibration circuit further comprises:
first and second current generators configured to generate corresponding first and second currents;
a first operational amplifier having
a first input configured to receive a first reference voltage,
a second input coupled between the first resistor and the first current generator to receive a first voltage caused by the first current flowing through the first resistor, the first PMOS transistor and the first NMOS transistor, and
an output coupled to the gates of the first through third PMOS transistors; and
a second operational amplifier having
a first input configured to receive a second reference voltage,
a second input coupled between the second resistor and the second current generator to receive a second voltage caused by the second current flowing through the second resistor, the second PMOS transistor and the second NMOS transistor, and
an output coupled to the gates of the first through third NMOS transistors.

11. The sensing circuit of claim 1, wherein the second input is configured to be selectively disconnected from the reference bit line.

12. The sensing circuit of claim 4, wherein the bit line clamping circuit comprises:
an n-channel metal-oxide semiconductor (NMOS) transistor having a drain coupled to the first or second input of the comparator, a source configured to be coupled to the corresponding data bit line or reference bit line, and a gate coupled to a power supply voltage node.

13. The sensing circuit of claim 4, wherein the bit line clamping circuit comprises:
a p-channel metal-oxide semiconductor (PMOS) transistor having a source coupled to a power supply voltage node;
a first n-channel metal-oxide semiconductor (NMOS) transistor having a drain coupled to the first or second input of the comparator, a source configured to be coupled to the corresponding data bit line or reference bit line, and a gate coupled to the drain of the PMOS transistor; and
a second NMOS transistor having a drain coupled to the drain of the PMOS transistor, a source coupled to the ground voltage node, and a gate coupled to the source of the first NMOS transistor,
wherein a gate of the PMOS transistor coupled to the gate of the second NMOS transistor.

14. A memory device, comprising:
a data bit line;
a reference bit line;
a memory cell coupled to the data bit line;
a reference cell coupled to the reference bit line;
a sensing resistor having a first end coupled to a power supply voltage node and a second end;
a reference resistor having a first end coupled to the power supply voltage node and a second end;
a comparator having
a first input coupled to the second end of the sensing resistor, the first input configured to be coupled to the memory cell via the data bit line,
a second input coupled to the second end of the reference resistor, the second input configured to be coupled to the reference cell via the reference bit line, and
an output, the comparator configured to generate at the output an output signal indicating a logic state of data stored in the memory cell based on a comparison between voltages at the first input and the second input; and
a reference column selector switch arranged between the reference bit line and the second input of the comparator, wherein the reference column selector switch is configured to selectively couple the reference bit line to the second input of the comparator;
a resistance calibration circuit configured to automatically calibrate a total resistance of the sensing resistor or the reference resistor, the resistance calibration circuit comprising:
a first resistor, a first PMOS transistor, and a first NMOS transistor coupled in parallel with each other; and
a second resistor, a second PMOS transistor, and a second NMOS transistor coupled in parallel with each other;
wherein
the sensing resistor or the reference resistor to be calibrated by the resistance calibration circuit comprises a third resistor, a third PMOS transistor, and a third NMOS transistor coupled in parallel with each other;
gates of the first through third PMOS transistors are coupled with each other; and
gates of the first through third NMOS transistors are coupled with each other.

15. The memory device of claim 14, wherein at least one of the sensing resistor or the reference resistor is a variable resistor.

16. The memory device of claim 14, further comprising:
a data column selector switch arranged between the data bit line and the first input of the comparator, the data column selector switch configured to selectively couple the data bit line to the first input of the comparator when the memory cell coupled to the data bit line is selected for a read operation.

17. The memory device of claim 16, further comprising:
a first bit line clamping circuit coupled between the first input of the comparator and the data column selector switch; and
a second bit line clamping circuit coupled between the second input of the comparator and the reference column selector switch;
wherein each of the first and second bit line clamping circuits is configured to clamp a voltage on the corresponding one of the data bit line and the reference bit line to a predetermined voltage level.

18. The memory device of claim 17, wherein the resistance calibration circuit further comprises:
first and second current generators configured to generate corresponding first and second currents;
a first operational amplifier having
a first input configured to receive a first reference voltage,
a second input coupled between the first resistor and the first current generator to receive a first voltage caused by the first current flowing through the first resistor, the first PMOS transistor and the first NMOS transistor, and
an output coupled to the gates of the first through third PMOS transistors; and
a second operational amplifier having
a first input configured to receive a second reference voltage,
a second input coupled between the second resistor and the second current generator to receive a second voltage caused by the second current flowing through the second resistor, the second PMOS transistor and the second NMOS transistor, and
an output coupled to the gates of the first through third NMOS transistors.

19. A method of detecting data stored in a memory cell, the method comprising:
connecting a data bit line associated with the memory cell to a sensing resistor via a first node;
connecting a reference bit line associated with a reference cell to a reference resistor via a second node in response to a decoded column address signal;
causing a cell current to flow from a power supply voltage node, through the sensing resistor, through the first node, via the data bit line and through the memory cell;
causing a reference current to flow from the power supply voltage node, through the reference resistor, through the second node, via the reference bit line and through the reference cell;
comparing voltages at the first and second nodes to detect a logic state of the data stored in the memory cell; and
automatically calibrating a resistance of at least one of the sensing resistor or the reference resistor, said calibrating comprising:
generating a first control signal based on a first comparison of a first reference voltage with a first voltage caused by a first current flowing through a first resistor, a first PMOS transistor and a first NMOS transistor,
supplying the first control signal to gates of first through third PMOS transistors,
generating a second control signal based on a second comparison of a second reference voltage with a second voltage caused by a second current flowing through a second resistor, a second PMOS transistor and a second NMOS transistor, and
supplying the second control signal to gates of first through third NMOS transistors;
wherein
the first resistor, the first PMOS transistor, and the first NMOS transistor are coupled in parallel with each other;
the second resistor, the second PMOS transistor, and the second NMOS transistor are coupled in parallel with each other; and
the sensing resistor or the reference resistor being calibrated comprises a third resistor, the third PMOS transistor, and the third NMOS transistor coupled in parallel with each other.

20. The method of claim 19, further comprising:
clamping voltages on each of the data bit line and the reference bit line to a predetermined voltage level.

* * * * *